US 8,853,526 B2

(12) United States Patent
Kostecki et al.

(10) Patent No.: US 8,853,526 B2
(45) Date of Patent: Oct. 7, 2014

(54) SURFACE PLASMON-ENHANCED PHOTOVOLTAIC DEVICE

(75) Inventors: Robert Kostecki, Lafayette, CA (US); Samuel Mao, Castro Valley, CA (US)

(73) Assignee: The Regents of The University of California, Oakland, CA (US)

( * ) Notice: Subject to any disclaimer, the term of this patent is extended or adjusted under 35 U.S.C. 154(b) by 950 days.

(21) Appl. No.: 12/663,503

(22) PCT Filed: Jul. 17, 2008

(86) PCT No.: PCT/US2008/070347
§ 371 (c)(1),
(2), (4) Date: Feb. 4, 2010

(87) PCT Pub. No.: WO2009/012397
PCT Pub. Date: Jan. 22, 2009

(65) Prior Publication Data
US 2010/0175745 A1    Jul. 15, 2010

Related U.S. Application Data

(60) Provisional application No. 60/950,557, filed on Jul. 18, 2007.

(51) Int. Cl.
*H01L 31/108*    (2006.01)
*H01L 31/0352*   (2006.01)
*H01L 31/18*     (2006.01)

(52) U.S. Cl.
USPC ........... 136/255; 136/256; 136/257; 136/258; 438/92; 257/E31.037; 257/E31.065; 977/720; 977/773; 977/810; 977/932; 977/948

(58) Field of Classification Search
USPC .................. 136/252, 255, 256; 257/E31.037, 257/E31.065; 977/720, 773, 810, 932, 948
See application file for complete search history.

(56) References Cited

U.S. PATENT DOCUMENTS

2003/0019517 A1*  1/2003  McFarland ............... 136/256
2005/0000565 A1*  1/2005  Zeng ........................ 136/256

OTHER PUBLICATIONS

MacFarland et al., "A photovoltaic device structure based on internal electron emission", Nature Letters, 2003.*
"Maneuvering the Surface Plasmon Resonance of Silver Nanostructures through Shape-Controlled Synthesis", Wiley et al., J. Phys. Chem B, 2006.*
Kostecki, R. et al., "Effect of the surface roughness on the spectral distribution of photoemission current at the silver/solution contact", J. Appl. Phys. 77 (9), May 1, 1995.
Mao, Samuel S., "Nanolasers: Lasing from nanoscale quantum wires", Int. J. of Nanotechnology, vol. 1, Nos. 1/2, 2004.
McFarland, Eric W. et al., "A photovoltaic device structure based on internal electron emission", Nature, vol. 421, Feb. 6, 2003.
Ji, Xiaozhong et al., "Electron flow generated by gas phase exothermic catalytic reactions using a platinum—gallium nitride nanodiode", J. Am. Chem. Soc., 2005, 127, 5792-5793.
Ji, Xiaozhong et al., "The catalytic nanodiode: gas phase catalytic reaction generated electron flow using nanoscale platinum titanium oxide schottky diodes", American Chemical Society, Nano Letters, 2005, vol. 5, No. 4, 753-756.
Merschdorf, M. et al., "Photoemission from multiply excited surface plasmons in Ag nanoparticles", Applied Physics A, 71, 547-552 (2000), Jun. 26, 2000.

* cited by examiner

*Primary Examiner* — Matthew Martin
(74) *Attorney, Agent, or Firm* — Weaver Austin Villeneuve & Sampson LLP

(57) ABSTRACT

Photovoltaic devices are driven by intense photoemission of "hot" electrons from a suitable nanostructured metal. The metal should be an electron source with surface plasmon resonance within the visible and near-visible spectrum range (near IR to near UV (about 300 to 1000 nm)). Suitable metals include silver, gold, copper and alloys of silver, gold and copper with each other. Silver is particularly preferred for its advantageous opto-electronic properties in the near UV and visible spectrum range, relatively low cost, and simplicity of processing.

13 Claims, 3 Drawing Sheets

SURFACE PLASMON-ENHANCED PHOTOVOLTAIC DEVICE

CROSS-REFERENCE TO RELATED APPLICATIONS

This application claims priority to U.S. Provisional Patent Application No. 60/950,557, titled SURFACE PLASMON-ENHANCED PHOTOVOLTAIC DEVICE, filed Jul. 18, 2007, the disclosure of which is incorporated herein by reference in its entirety and for all purposes.

STATEMENT OF GOVERNMENTAL SUPPORT

The invention described and claimed herein was made at least in part utilizing funds supplied by the U.S. Department of Energy under Contract No. DE-AC02-05CH11231. The Government has certain rights in this invention.

BACKGROUND OF THE INVENTION

Solar energy is clean, abundant, widespread and renewable. Various technologies exist for capturing solar energy, concentrating it, storing it, and converting it into other useful forms of energy. Solar energy technologies have great potential benefit in that they can diversify energy supply, reduce dependence on fossil fuels, offset greenhouse gas emissions and improve air quality.

Edmond Becquerel first discovered the photovoltaic effect in 1839. He found that certain materials produced a small amount of electric current when exposed to sunlight. For long time the study of photovoltaics (PV) remained a curiosity until Bell Labs developed the first crystalline silicon photovoltaic cell with a conversion efficiency of about 4% in 1954. The first major commercial push for photovoltaics came from the space industry for the use in satellites. However, the high cost of these devices prevented large-scale commercialization for many years. Substantial government and industry research investments into photovoltaics as a general energy source did not occur until the energy crisis in the 1970s. At present, a broad range of homojunction, heterojunction p-i-n and n-i-p, and multijunction semiconductor devices exist that offer up to 50% total conversion efficiency.

In the last twenty-five years, the cost of PV has come down by several orders of magnitude. Unfortunately, about half the cost of a PV system remains in the PV module itself.

SUMMARY OF THE INVENTION

The present invention provides innovative photovoltaic devices driven by intense photoemission of "hot" electrons from a suitable nanostructured metal. The metal should be an electron source with surface plasmon resonance within the visible and near-visible spectrum range (near IR to near UV (about 300 to 1000 nm)). Suitable metals include silver, gold, copper and alloys of silver, gold and copper with each other. Silver is particularly preferred for its advantageous optoelectronic properties in the near UV and visible spectrum range, relatively low cost, and simplicity of processing.

Illumination of nanostructured Ag (e.g., particle size about 1-50 nm) creates multiply excited surface plasmons in Ag nanoparticles. The surface plasmon in nanoparticles is also known as the Mie plasmon or the surface plasmon polariton (SPP) that corresponds to the collective motion of the electrons coupled directly to a transverse light field. The resonant multiple excitation of the surface plasmon resonance in Ag nanoparticles leads to a strong enhancement of the photoemission yield. A substantial portion of the surface plasmons in Ag nanoparticles transfer their total excitation energy to a single photoelectron. The decay of the excited plasmons leads to the generation of hot electrons, which carry the total energy of the collective mode, i.e., up to 7 eV. The resulting hot electrons can travel in excess of the approximately 20 nm electron mean free path in silver, and surmount a Schottky barrier formed at the junction of silver and an underlying semiconductor (e.g., $TiO_2$). If the electron energy is larger than the Schottky barrier, the excited electron can escape from the Ag nanoparticle into the semiconductor conduction band. By collecting photoexcited hot electrons in the semiconductor layer a steady-state electron flow is produced upon continuous irradiation of a silver electrode with visible and near UV light.

In one aspect, the invention relates to an electronic device comprising a metal electron source layer having a nanostructured metal surface with a surface plasmon resonance within the visible and near-visible spectrum range; a semiconductor layer in contact with the metal electron source layer, wherein the metal electron source layer and the semiconductor layer form an interface that is a Schottky barrier; and an electrode layer in contact with the semiconductor layer, wherein the electrode layer forms an ohmic contact to the semiconductor layer.

Associated photovoltaic devices and methods of their making are also provided.

The invention provides an effective, low-cost PV device that is readily manufactured by semiconductor device fabrication techniques readily adaptable for the purpose by those skilled in the art given the description provided herein.

These and other aspects of the present invention are described in more detail in the description that follows.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF SPECIFIC EMBODIMENTS

Figure 1:
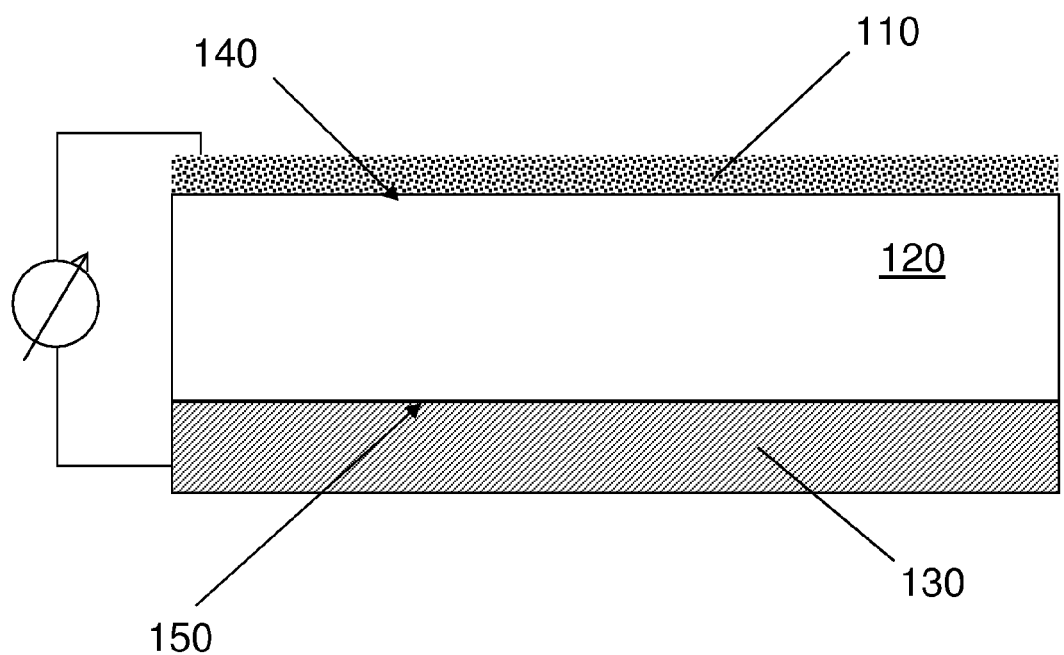
FIG. 1 is a cross section schematic diagram showing the basic components of a metal/semiconductor Schottky diode photovoltaic cell, according to an embodiment of the invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail so as to not unnecessarily obscure the present invention.

Introduction

The present invention provides innovative photovoltaic devices driven by intense photoemission of "hot" electrons from a suitable nanostructured metal. Silver is particularly preferred for its advantageous opto-electronic properties in the near UV and visible spectrum range, relatively low cost, and simplicity of processing.

Illumination of a nanostructured Ag (e.g., particle size about 1-50 nm) creates multiply excited surface plasmons in Ag nanoparticles. The surface plasmon in nanoparticles is also known as the Mie plasmon or the surface plasmon polariton (SPP) that corresponds to the collective motion of the electrons coupled directly to a transverse light field. The resonant multiple excitation of the surface plasmon resonance in Ag nanoparticles leads to a strong enhancement of the photoemission yield. A substantial portion of the surface plasmons in Ag nanoparticles transfer their total excitation energy to a single photoelectron. The decay of the excited plasmons leads to the generation of hot electrons, which carry the total energy of the collective mode, i.e., up to 7 eV. The resulting hot electrons can travel in excess of the approximately 20 nm electron mean free path in silver, and surmount a Schottky barrier formed at the junction of silver and an underlying semiconductor (e.g., $TiO_2$). If the electron energy is larger than the Schottky barrier, the excited electron can escape from the Ag nanoparticle into the semiconductor conduction band. By collecting photoexcited hot electrons in the semiconductor layer a steady-state electron flow is produced upon continuous irradiation of a silver electrode with visible and near UV light.

The invention provides an effective, low-cost PV device that is readily manufactured by well-known and easily adaptable semiconductor device fabrication techniques.

Device Principles, Structure and Operation

The embodiments of the invention, as disclosed herein, make use of "hot" electrons generated in nanostructured metal films by sunlight to drive a new and innovative photovoltaic device.

It has previously been demonstrated that chemisorption of atoms on surfaces can produce electrons with high kinetic energy, which are often referred to as "hot" electrons. Evidence of hot electron generation under a variety of experimental conditions is reported in the literature. Hot electrons have been observed upon oxygen adsorption on a thin cesium metal film, chlorine adsorption on potassium, and NO molecules impinging on a gold surface. Electrons of kinetic energy greater than 0.5 eV have been detected when hydrogen or oxygen atoms adsorbed onto silver thin films. An innovative method of conversion of chemical energy directly into an electron current was disclosed in 2003 by Zuppero and Gidwani in U.S. Pat. No. 6,649,823. They used a metal/semiconductor Schottky diode to collect hot electrons generated at the surface of a thin-film metal catalyst. Hot electrons traveled through a thin layer of metal catalyst to cross the Schottky barrier at the junction of the metal and an underlying semiconductor and were thermalized in the conduction band of the semiconductor.

In addition, it has been demonstrated that exothermic chemical catalytic reaction energy can be converted directly into hot electrons (see for example, Ji, X.; Zuppero, A.; Gidwani, J. M.; Somorjai, G. A., Nano Lett., 2005; 5(4); 753-756, and Ji, X.; Zuppero, A.; Gidwani, J. M.; Somorjai, G. A., J. Am. Chem. Soc., 2005; 127(16); 5792-5793). A platinum-titanium dioxide ($Pt/TiO_2$) Schottky nanodiode was constructed to generate electron flow by gas phase exothermic catalytic carbon monoxide oxidation catalyzed by the platinum. Using a diode consisting of a 5 nm platinum thin film with a diameter of 1 mm formed on a 150 nm titanium dioxide film, hot electron currents up to forty microamperes were generated in steady state for more than an hour.

Moreover, a multilayer photovoltaic device structure in which photon absorption instead occurs in photoreceptors deposited on the surface of an ultrathin metal-semiconductor junction Schottky diode was demonstrated in Eric W. McFarland and Jing Tang, Nature 2003, 421: 616. The photon-to-electron conversion in this device occurs in four steps: (i) light absorption occurs in the surface-absorbed photoreceptors, giving rise to energetic electrons; (ii) electrons from the photoreceptor excited state are injected into conduction levels of the adjacent conductor; (iii) the electrons traverse the metal, cross the Schottky barrier and enter conduction levels of the semiconductor and; (iv) the absorbed photon energy is preserved in the remaining excess electron free energy when it is collected at the back ohmic contact, giving rise to the photovoltage.

Hot electrons can also be produced by optically excited surface-plasmon polaritons (SPPs) in metallic electrodes. The pathway through which optically excited plasmons contribute to photoemissive yield involves transfer of energy from decaying surface plasmons to a single electron. While most metals exhibit plasma frequencies corresponding to energies higher than 10 eV and thus exceed their work functions in vacuum, this is not the case for a low plasma frequency metal such as silver. In fact, the energies of bulk (3.8 eV) and surface (3.6 eV) plasmons for silver lie in a range well suited for optical excitation. Moreover, the plasmon peak broadens and shifts down in energy from UV to visible wavelengths when metal particles, particularly nanoparticles, are used. It has been found that the peak position and width of the SPP band depend on the nanoparticle size as well as on the shape and environment of the nanoparticles. Thus various surface treatments or deposition techniques can cause changes in the threshold and in the magnitude of the photoemission current in a way similar to the case of surface enhancement of Raman scattering (SERS).

Recently, the nonlinear response due to the surface plasmon in silver has attracted considerable interest and initiated many theoretical and experimental studies. Simulations reveal that for a multiply excited plasmon mode, strong and extremely fast multiphoton electron emission is expected within the first plasmon oscillation period. These mechanisms were investigated and confirmed experimentally by directly probing the distribution of photo-excited electrons in the silver nanoparticles. It has been shown that the resonant multiple excitation of the surface plasmon resonance in Ag nanoparticles grown on graphite produces electrons of energies smaller than or equal to 7 eV and leads to a strong enhancement of the photoemission yield. Further experimental evidence for the plasmon-assisted electron emission (>1 $mA/cm^2$) from rough Ag electrodes was found in photoelectrochemical catalysis.

It has been found that variations of the nanostructure parameters of a metal electron source allow strong coupling between electronic and photonic resonances, which leads to the formation of a SPP. These nanostructures allow for easy tuning of their spectral, scattering, and absorption properties which can be exploited in plasmonic photovoltaic devices. These devices do not require organic photosensitizers and can have an entirely inorganic structure that is readily manufactured by semiconductor device fabrication techniques readily adaptable for the purpose by those skilled in the art given the description provided herein.

FIG. 1 is a schematic cross sectional drawing that shows basic components for a photovoltaic cell 100 according to an embodiment of the invention. A metal electron source layer, in this case a nanostructured silver thin film first electrode 110, is in contact with a layer of n-type $TiO_2$ 120. The interface 140 between the silver film 110 and the $TiO_2$ layer 120 is a Schottky barrier. A second electrode 130 is on the opposite side of the $TiO_2$ layer 120. The interface 150 between the $TiO_2$ layer 120 and the second electrode 130 has ohmic character.

When sunlight illuminates the nanostructured silver thin film 110, multiply excited surface plasmons are created in the component Ag nanoparticles. The excited plasmons in the Ag nanoparticles transfer their total excitation energy to a single electron. The decay of the collective excitation leads to formation of a hot electron, which carries the total energy of the collective mode, i.e., up to about 7 eV. It takes two or more photons to produce the plasmons that, in turn, produce the hot electron. However, this mechanism is not limited to doubly excited surface plasmons. Multiply-excited (threefold and more) surface plasmons also exist and can decay via energy transfer to a single electron. Most of the hot electrons can travel in excess of the electron mean free path in silver (about 20 nm), without losing much of their kinetic energy, to reach the interface 140 between the silver film 110 and the $TiO_2$ layer 120. The Schottky barrier at the interface 140 has a barrier height of about 0.7 eV. Hot electrons that arrive at the interface 140 with kinetic energies higher than the barrier height (0.7 eV) can escape from the silver film 110 into the conduction band of the $TiO_2$ 120 and thermalize. With continuous irradiation of the silver thin film with near UV and/or visible light, photoexcited hot electrons can escape into the $TiO_2$ layer continuously to produce a steady-state electron flow. The electron flux through the diode depends on 1) the hot electron photogeneration rate, 2) the thickness of the silver film 110, 3) the Schottky barrier 140 energy, and 4) the conductivity and thickness of the semiconductor 120.

It is useful to make the metal electron source continuous and for its thickness to be on the order of the mean free path of electrons in the metal. In one embodiment, the metal electron source is a metal thin film that is electronically continuous with an average thickness that is no more than the combined surface plasmon propagation depth and free path of electrons in the metal (e.g., for silver about 20 nm). The thickness of a suitable metal (e.g., silver or alloy) film can be about 1-50 nm. In one embodiment, a silver thin film 110 has a thickness less than about 20 nm. In another embodiment, the silver thin film 110 has a thickness less than about 10 nm. In another embodiment, the silver thin film 110 has a thickness between about 1 and 5 nm.

A metal electron source in accordance with the present invention is most basically a nanostructured metal layer (e.g., thin film) in contact with the semiconductor layer to form the Schottky barrier. However, according to an alternative embodiment of the invention, it is also possible for the metal electron source to indirectly contact the semiconductor via another electronic conductor. For example, a metal electron source layer in accordance with the invention can take the form of metal (e.g., Ag) nanoparticles on an electronically conductive thin film (e.g., carbon) on a semiconductor (e.g., $TiO_2$) layer. In this way, the metal electron source layer can be entirely a nanostructured metal layer, or a nanostructured metal surface on a non metal or other metal. Thus, a metal electron source layer in accordance with the present invention encompasses both these direct and indirect contacts between the metal electron source and the semiconductor layer.

Figure 2:
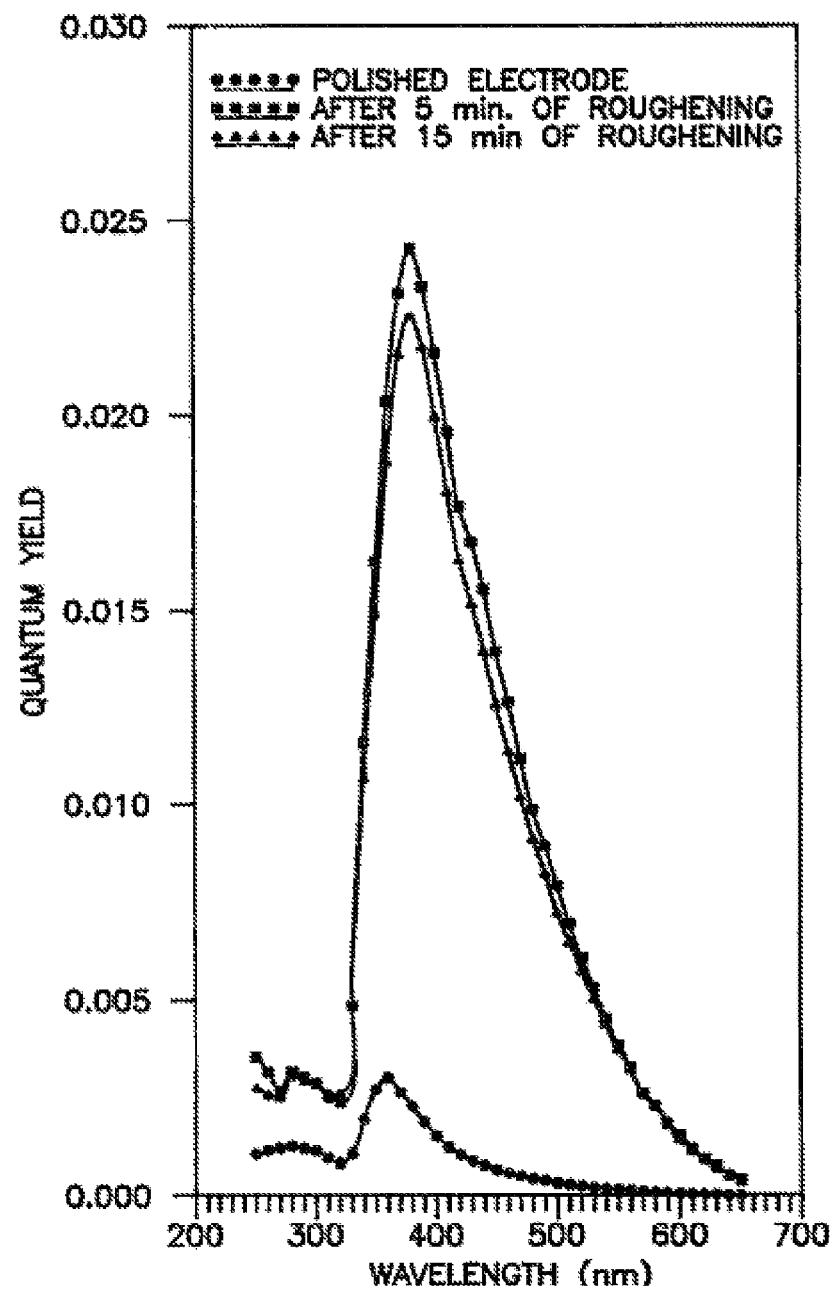
FIG. 2 is a plot of photoemission quantum yield as a function of wavelength of incident light for polished and roughened silver surfaces.

Silver absorbs electromagnetic wavelengths in the visible and near UV range. The absorption peak of native silver is at a wavelength of about 360 nm. When silver is in the form of nanoparticles, it has been found that the wavelength absorption range can broaden, extending far into visible wavelengths, for example to about 650 nm. This is illustrated by FIG. 2 which is a plot of photoemission quantum yield as a function of wavelength of incident light for polished and roughened silver surfaces showing absorption characteristics. A polished silver surface was roughened by a series of oxidation-reduction cycles performed in 0.1 M $NaClO_4$. (R. Kostecki and J. Augustynski, J. Appl. Phys. 77 (9), 4701 (1995)) It is clear that the roughening of the surface increases the quantum yield of photoemission. This effect can be optimized by appropriately nanostructuring the metal (e.g., Ag) surface to provide surface irregularities in the nm to tens of nm range.

With regard to the semiconductor component of the device, while not essential, it is desirable to reduce resistance attributable to grain boundaries. A semiconductor thickness that allows a single grain to form boundaries with the Schottky barrier and the Ohmic contact is desirable.

Figure 3:
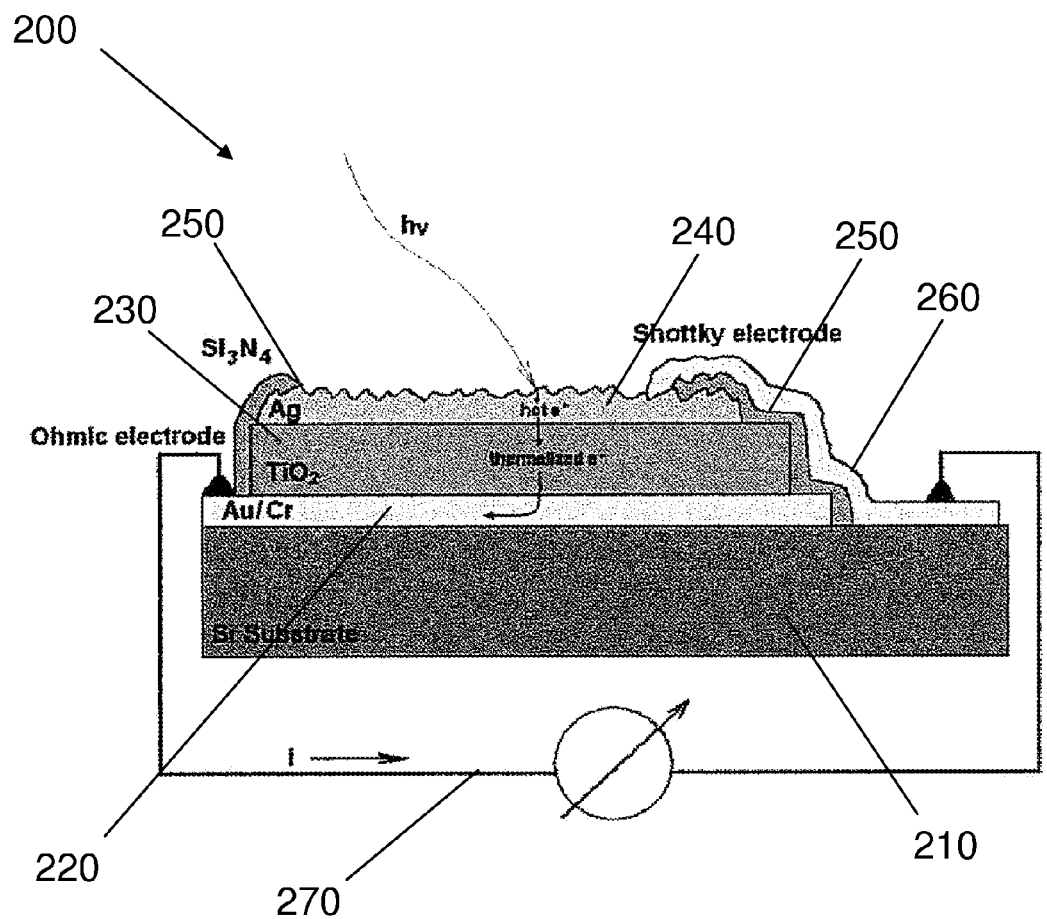
FIG. 3 is a cross section schematic diagram showing a Ag/n-$TiO_2$ Schottky diode photovoltaic cell device, according to an embodiment of the invention.

One embodiment of a photovoltaic diode device 200 in accordance with the present invention is shown in the schematic drawing of FIG. 3. A p-type Si (100) wafer 210 with a surface covered by about 100 nm $SiO_2$ (not shown) is used as a smooth, insulating substrate. A gold electrode 220 layer over a chromium underlayer (e.g., about 5 nm thick; not shown) is on the $SiO_2$ surface. A titanium dioxide thin film 230 is on the gold electrode 220. The $TiO_2$ film 230 can have a thickness between about 10 and 300 nm; or 2 and 200 nm; or 50 and 150 nm, for example about 150 nm. As noted above, reducing the grain boundaries to be crossed will improve the conductivity and enhance performance. A nanostructured silver thin film 240 with a thickness between about 1 nm and 30 nm lies over the $TiO_2$ layer 230 to produce a photosensitive area of the device. In one embodiment, the nanostructured silver thin film 240 has a thickness between about 5 and 20 nm, for example about 15 nm. As noted above, it is useful to make the thickness of the silver thin film 240 on the order of the mean free path of electrons in silver. In one embodiment, the silver film is electronically continuous and its average thickness is no more than the combined surface plasmon propagation depth and free path of electrons in silver. An insulating layer of silicon nitride 250 (e.g., about 100 nm in thickness) can be used to separate electronically the ohmic Au electrode 220. Finally, a front gold contact electrode 260 is on the silicon nitride 250 and contacting a portion of the nanostructured silver 240. A diode circuit is made by providing an electrical connection 270 between the ohmic Au electrode 220 and the front gold contact electrode 260.

Fabrication

Various thin film deposition techniques such as e-beam evaporation, sputtering and chemical vapor deposition can be used to produce the multilayer structure described herein. Multiphoton processes involving the surface plasmon in nanoparticles and on planar surfaces show that the quantized nature of the mechanism is most prominent in the case of the localized collective mode in nanoparticles. The photon absorption and relaxation of photoexcited electrons in small nanoparticles can be controlled by changing particle shape and size and tuning the surface plasmon resonance in and out. While detailed knowledge about the dynamics of the optical and electronic properties of nanometer-sized metal particles is lacking, performance in this context is enhanced by the formation of metal surface irregularities in the nm or tens of nm.

Recent advancements in the chemical synthesis and deposition techniques of metal nanostructures of various shapes such as rods, shells, cups, rings, disks, and cubes, and development of deep submicron lithographic methods for fabricating nanostructure grids and arrays provide the tools for exploiting plasmon properties of metal nanostructures of arbitrary geometry in plasmonic devices, including photovoltaics.

In one embodiment, silver nanoparticles can be chemically synthesized using a technique based on solution chemistry. One example is to use the reaction between sodium borohydride (or a similar hydride) and silver nitrate solutions of concentration in the vicinity of 0.001M. Polyvinyl pyrrolidone (or a similar water-soluble polymer) can be used to prevent silver particle aggregation. Evaporation of the solution mix yields a layer of silver nanoparticles, for example, in the range of about 1-50 nm.

A second approach is based on physical deposition in a vacuum environment. A solid metal target is vaporized using resistive heating or bombarded by a laser, or an ion or electron beam to generate Ag vapor. The vapor is then deposited on the desired substrate or the device layer to form a layer of metal nanoparticles. In a specific embodiment, forming a nanostructured silver layer can be achieved by a relatively simple and consistent method of film deposition and processing, which offers the flexibility of manufacturing high-performance devices with a range of size scales. The approach is based on ultrafast pulsed laser deposition, which can be optimized for nanostructured material fabrication. An ultrafast laser pulse can ionize and vaporize a precursor target material without causing significant target melting. The homogeneous precursor vapor is deposited onto a substrate with precise temperature control. Depending on the temperature history of the laser-produced and ionized vapor, different size nanoparticles, for example, in the range of about 1-50 nm start to form either before or after the vapor arrives at the substrate surface. One unique benefit of using an ultrafast laser beam is the process is that material-independent; ultrafast laser ablation does not depend on the thermal properties of the material, offering unprecedented control of the fabrication process.

Alternative Embodiments

While the embodiments of the invention are primarily described and illustrated in the context of nanostructured silver as the metal electron source on n-$TiO_2$ as the semiconductor of the Schottky diode, other metal electron sources and semiconductor materials may be used. The metal should be an electron source with surface plasmon resonance within the visible and near-visible spectrum range (e.g., from about 300 to 1000 nm). Suitable metals include silver, gold, copper and alloys of silver, gold and copper with each other. Silver is preferred for its advantageous opto-electronic properties, relatively low cost, and simplicity of processing.

The selection of the metal electron source and semiconductor should be coordinated so that a Schottky barrier formed at their interface is lower than the energy of the hot electrons formed in the metal by incident solar energy, but high enough so that electrons that cross the barrier are unable to cross back over. Possible alternative wide-band gap semiconductors include Si, GaN, SiC, CdTe, AsGa etc.

Conclusion

The theoretical efficiency of a surface plasmon-enhanced photovoltaic device as described herein is as high as 50%. The materials used are plentiful and inexpensive. Thin film deposition techniques have been in use in manufacturing for many years. Given the description provided herein, it is straightforward to adapt and scale up production of these hot electron photovoltaic devices to manufacturing levels. In addition, fabrication techniques such as ultrafast pulsed laser deposition provide scalability and ease of manufacture with the potential for full automation. Finally, this fundamentally different approach to photovoltaic technology offers interesting and promising alternative to the traditional technology. It presents a true technological breakthrough, which may open avenues to future technologies of solar energy conversion.

Although the foregoing invention has been described in some detail for purposes of clarity of understanding, certain changes and modifications will be apparent to those of skill in the art. It should be noted that there are many alternative ways of implementing both the process and materials and apparatuses of the present invention. Accordingly, the present embodiments are to be considered as illustrative and not restrictive, and the invention is not to be limited to the details given herein.

What is claimed:

1. An inorganic electronic device comprising:
   a nanostructured metal electron source layer comprising a roughened metal surface having surface irregularities in the nm to tens of nm range and a surface plasmon resonance within the visible and near-visible spectrum range;
   a semiconductor layer in contact with the metal electron source layer, wherein the metal electron source layer and the semiconductor layer form an interface that is a Schottky barrier;
   and an electrode layer in contact with the semiconductor layer, wherein the electrode layer forms an ohmic contact to the semiconductor layer;
   wherein the nanostructured metal electron source layer comprises silver;
   wherein the semiconductor layer comprises $TiO_2$; and
   wherein the nanostructured silver layer is formed by bombarding a silver target with an ultrafast laser pulse to deposit a thin film of silver nanoparticles onto the layer of TiO2 and roughening the silver thin film by a series of oxidation-reduction cycles to provide surface irregularities in the nm to tens of nm range.

2. The device of claim 1, wherein the nanostructured metal layer is silver.

3. The device of claim 1, wherein the nanostructured metal layer is a silver alloy.

4. The device of claim 1, wherein the device is a photovoltaic device and the metal electron source layer is the topmost photovoltaic layer of the device.

5. The device of claim 1, wherein the semiconductor layer comprises n-type $TiO_2$.

6. The device of claim 1, wherein the electrode layer comprises gold.

7. The device of claim 1, further comprising an electrical connection between the nanostructured metal layer and the electrode.

8. An inorganic photovoltaic device comprising:
   A nanostructured metal layer comprising a roughened metal surface having surface irregularities in the nm to tens of nm range and a surface plasmon resonance within the visible and near-visible spectrum range that can absorb at least a portion of the electromagnetic spectrum of sunlight and produce hot electrons that have an energy gap no less than about 0.7 eV;
   A semiconductor layer in contact with the nanostructured metal layer to form a Schottky barrier with a barrier height of about 0.7 eV;

An electrode layer in contact with the semiconductor layer to form an ohmic contact;

wherein the nanostructured metal electron source layer comprises silver;

wherein the semiconductor layer comprises TiO$_2$; and wherein the nanostructured silver layer is formed by bombarding a silver target with an ultrafast laser pulse to deposit a thin film of silver nanoparticles onto the layer of TiO2 and roughening the silver thin film by a series of oxidation-reduction cycles to provide surface irregularities in the nm to tens of nm range.

9. The device of claim 8, wherein the nanostructured metal layer is the topmost photovoltaic layer of the device.

10. The device of claim 8, further comprising an electrical connection between the nanostructured metal layer and the electrode.

11. An inorganic electronic device, comprising:

A nanostructured silver layer comprising a roughened silver surface having surface irregularities in the nm to tens of nm range and a surface plasmon resonance within the visible and near-visible spectrum range;

An n-type TiO2 layer in contact with the silver layer;

A metal electrode in contact with the TiO2 layer to form an ohmic contact;

An electrical connection between the silver layer and metal electrode;

wherein the nanostructured silver layer is formed by bombarding a silver target with an ultrafast laser pulse to deposit a thin film of silver nanoparticles onto the layer of TiO2 and roughening the silver thin film by a series of oxidation-reduction cycles to provide surface irregularities in the nm to tens of nm range.

12. A method of making an inorganic photovoltaic device, comprising:

Depositing a metal electrode layer onto a substrate;

Forming a semiconductor layer on the metal layer;

Forming a nanostructured layer of a metal comprising a roughened metal surface having surface irregularities in the nm to tens of nm range and having a surface plasmon resonance within the visible and near-visible spectrum range on the semiconductor layer;

Wherein the nanostructured metal layer and the semiconductor layer form an interface that is a Schottky barrier; wherein the electrode layer forms an ohmic contact to the semiconductor layer;

wherein the nanostructured metal electron source layer comprises silver;

wherein the semiconductor la comprises TiO$_2$; and wherein the nanostructured silver layer is formed by bombarding a silver target with an ultrafast laser pulse to deposit a thin film of silver nanoparticles onto the layer of TiO2 and roughening the silver thin film by a series of oxidation-reduction cycles to provide surface irregularities in the nm to tens of nm range.

13. The method of claim 12, wherein the nanostructured metal layer is the topmost photovoltaic layer of the device.

* * * * *